United States Patent [19]

Hague

[11] 4,443,717
[45] Apr. 17, 1984

[54] HIGH RESOLUTION FAST DIODE CLAMPED COMPARATOR

[75] Inventor: Yusuf A. Hague, San Jose, Calif.

[73] Assignee: American Microsystems, Inc., Santa Clara, Calif.

[21] Appl. No.: 335,910

[22] Filed: Dec. 30, 1981

Related U.S. Application Data

[63] Continuation-in-part of Ser. No. 111,606, Jan. 14, 1980, abandoned.

[51] Int. Cl.³ .............................................. H03K 5/24
[52] U.S. Cl. .................................. 307/362; 307/561; 307/565; 330/253
[58] Field of Search ............... 307/355, 362, 561, 565, 307/304, 264; 330/253

[56] References Cited

U.S. PATENT DOCUMENTS 4,053,795 10/1977 Cochran ............................. 330/253

*Primary Examiner*—John Zazworsky
*Attorney, Agent, or Firm*—Alan H. MacPherson; Steven F. Caserza; Richard Franklin

[57] ABSTRACT

An electronic comparator circuit (10) adapted for implementation as an integrated circuit semiconductor device provides high resolution and high speed performance. The circuit comprises a first differential amplifier (12) with clamping diodes (50, 52) that allow a fast response; a source-follower stage (14) connected to the first differential amplifier for buffering its output to enable it to be broadbanded; a second differential amplifier (16) driven by the source-follower stage for handling large signal swings while providing additional gain, a level shift stage (18) for driving the output stage in a class A-B mode, and a cascode output stage (20) which provides increased circuit gain and an output signal which ranges from the positive supply voltage ($V_{DD}$) to the negative supply voltage ($V_{SS}$).

6 Claims, 1 Drawing Figure

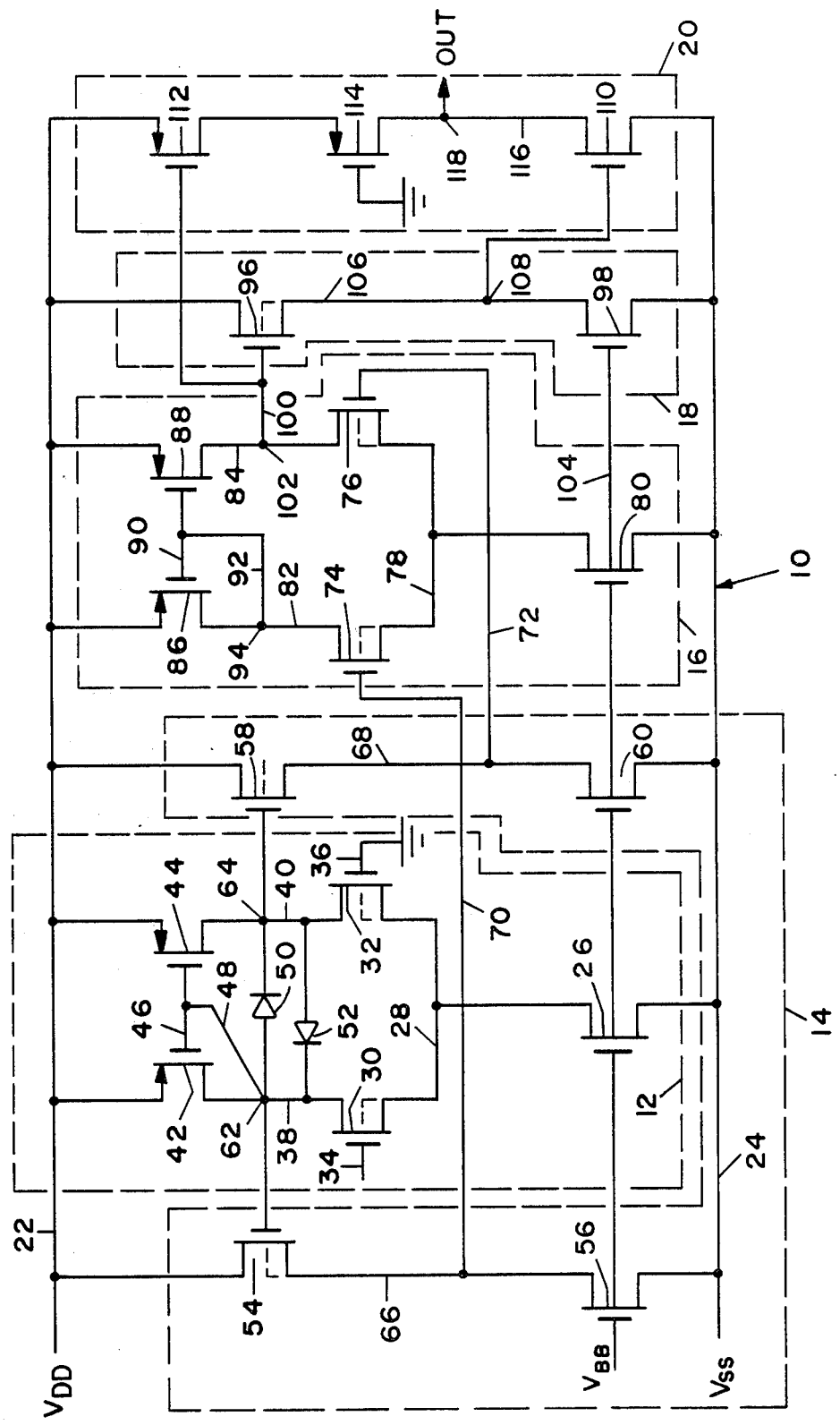

HIGH RESOLUTION FAST DIODE CLAMPED COMPARATOR

BACKGROUND OF THE INVENTION

This application is a continuation-in-part of Ser. No. 111,606 filed Jan. 14, 1980 and now abandoned.

FIELD OF THE INVENTION

This invention relates to an improved comparator circuit particularly suitable for implementation as an integrated circuit device using complementary metal-oxide-silicon (CMOS) technology.

DESCRIPTION OF THE PRIOR ART

Comparators have long been used extensively as building blocks in electronic circuits for the purpose of comparing and amplifying the difference between two signal sources, as for example, in analog to digital conversion circuits. Often this difference between two signal sources is required to be sensed at a very rapid rate. Such speed requirements became especially difficult to meet in the attempted implementation of comparator circuits as part or larger integrated circuit devices where the difference in the signal values is small. Previous attempts to achieve relatively high speed are described, for example, in IEEE Journal of Solid State Operation Circuits, February 1979, pages 38-46, and Memorandum No. UCB/ERL M78/27, May 24, 1978, College of Engineering, University of California, Berkeley, California, Page 128. However, such circuits as disclosed therein require a relatively large amount of integrated circuit "chip" area and also large amounts of power. In providing a comparator as part of a monolithic integrated circuit, such as a coder-decoder (codec) for use in digital transmission of voice signals, it is necessary to maintain chip area and power requirements as low as possible. The present invention solves this problem.

SUMMARY

A comparator constructed in accordance with the principles of the present invention comprises a CMOS circuit consisting of four stages. The first stage is an input preamplifier in the form of a differential amplifier which receives the two input signals to be compared. Connected to this differential amplifier is a source follower stage that provides a low impedance output which drives another differential amplifier. This second differential amplifier is connected to a level shift stage to drive a cascoded output stage. The input preamplifier is a high gain, boradbanded stage that serves to deliver, with high speed, a relatively high amplitude signal to the succeeding gain stages which in turn are designed to respond rapidly to high amplitude signal stimuli. The broadbanding is achieved by the source followers which buffer the high input capacitance of the second differential amplifier and the high output impedance of the first differential amplifier. Diode clamping is used to force the preamplifier to remain in the saturation region to provide adequate gain during operation with a relatively small voltage differential between the two input signals and also provide a relatively fast response for the input stage.

Other objects, advantages and features of the invention will become apparent from the following detail description of one preferred embodiment presented in conjunction with the accompanying drawing.

BRIEF DESCRIPTION OF THE DRAWING

The single FIGURE is a circuit diagram of a comparator embodying principles of the present invention.

DETAILED DESCRIPTION

With reference to the drawing, a circuit diagram is shown for a comparator 10 embodying principles of the present invention which is particularly well suited for implementation as part of a monolithic integrated circuit semiconductor device. In broad terms, the circuit comprises a first differential amplifier section 12 which is essentially an input preamplifier that receives the two input signals to be compared. Connected to the amplifier section 12 is a source-follower stage 14 which supplies input signals to a second differential amplifier section 16. The second differential amplifier 16 is connected through a level shift network 18 to a cascode output stage 20.

All of the aforesaid circuit components may be formed using metal-oxide-silicon field effect transistors (MOSFETs) as part of a monolithic integrated circuit structure. Thus, as shown, all circuit elements are connected between the positive supply voltage $V_{DD}$ on lead 22 and the negative supply voltage $V_{SS}$ on lead 24. The first differential amplifier 12 is comprised of N channel MOSFET 26 having its drain lead connected to the $V_{SS}$ lead 24 and its source lead connected to a lead 28. The gate lead of N channel MOSFET 26 is connected to a substantially constant bias voltage $V_{BB}$ on lead 104, thereby causing MOSFET 26 to operate as a constant current source. Differential amplifier 12 also includes an inverting input leg containing P channel MOSFET 42 and N channel MOSFET 30, and a non-inverting input leg containing P channel MOSFET 44 and N channel MOSFET 32.

The drain leads of P channel MOSFETs 42 and 44 are connected to the $V_{DD}$ lead 22. The source leads of P channel MOSFETs 42 and 44 are connected to nodes 62 and 64, respectively. Nodes 62 and 64 serve as the output nodes of the first differential amplifier stage 12. Node 62 is connected via lead 38 to the source lead of N channel MOSFET 30. Similarly, node 64 is connected via lead 40 to the source lead of N channel MOSFET 32. The drain leads of MOSFETs 30 and 32 are connected by lead 28 to the source lead of current source MOSFET 26. The gate leads of P channel MOSFETs 42 and 44 are connected together by lead 46, and in turn connected via lead 48 to node 62. P channel MOSFETs serve as load devices between nodes 62 and 64, respectively, and $V_{DD}$ lead 22. The gate lead of MOSFET 30 is connected by lead 34 to one input signal source to be compared, and the gate lead of MOSFET 32 is connected by lead 36 to ground, when the input signal applied to lead 34 is to be compared with ground. Naturally, the gate lead of MOSFET 32 may be connected by lead 36 to an input signal other than ground, which will then be compared with the input signal applied by lead 34 to the gate of MOSFET 30.

As the input voltage applied to lead 34 increases with respect to the input signal applied to lead 36, N channel MOSFET 30 conducts more current, thereby decreasing the voltage on node 62. At the same time, current flow through MOSFET 32 decreases, thereby raising the voltage on node 64. Thus, the output voltage on node 62 is inversely related to the difference between the input voltages on leads 34 and 36, and the output voltage on node 64 is directly related to the difference between the input voltages on leads 34 and 36. Thus, MOSFETs 42 and 30 form the inverting input leg of differential amplifier 12, and MOSFETs 44 and 32 form the noninverting input leg of differential amplifier 12. MOSFET 30 thus serves as the inverting input transistor, with the gate of MOSFET 30 and lead 34 serving as the inverting input lead of differential amplifier 12. Similarly, MOSFET 32 serves as the noninverting input transistor, with the gate of MOSFET 32 and lead 36 serving as the noninverting input lead to differential amplifier 12. Connected between nodes 62 and 64 are two clamping diodes 50 and 52, which serve to prevent the difference between the voltage on node 62 and the voltage on node 64 from exceeding one forward biased diode voltage drop.

Source follower stage 14 includes a first leg containing N channel MOSFET 54 and N channel MOSFET 56. The source lead of N channel MOSFET 54 is connected to $V_{DD}$ lead 22, and the drain lead of MOSFET 54 is connected by lead 66 to the source lead of MOSFET 56. The drain lead of MOSFET 56 is connected to $V_{SS}$ lead 24. The gate lead of N channel MOSFET 56 is connected to the bias voltage $V_{BB}$ on lead 104, thereby causing MOSFET 56 to operate as a constant current source. Source follower stage 14 also includes a second leg containing N channel MOSFET 58 and N channel MOSFET 60. The source lead of MOSFET 58 is connected to $V_{DD}$ lead 22 and the drain lead of MOSFET 58 is connected by lead 68 to the source lead of MOSFET 60. The drain lead of MOSFET 60 is connected to the $V_{SS}$ lead 24. The gate lead of N channel MOSFET 60 is connected to the bias voltage $V_{BB}$ on lead 104, thus causing MOSFET 60 to operate as a constant current source. The gate lead of MOSFET 54 is connected to output node 62 of differential amplifier stage 12, and the gate lead of MOSFET 58 is connected to the output node 64 of differential amplifier stage 12.

The second differential amplifier stage 16 includes N channel MOSFET 80 serving as a constant current source. MOSFET 80 has its drain lead connected to the $V_{SS}$ lead 24, its gate lead connected to the bias voltage $V_{BB}$ on lead 104, and its source lead connected to lead 78 which in turn interconnects the inverting input leg and the noninverting input leg of second differential amplifier stage 16. The noninverting input leg of differential amplifier stage 16 includes P channel MOSFET 86 and N channel MOSFET 74. The source lead of P channel MOSFET 86 is connected to the $V_{DD}$ lead 22, the drain lead of MOSFET 86 is connected by lead 82 to the source lead of MOSFET 74, and the drain lead of MOSFET 74 is connected to the source lead of current source MOSFET 80 by lead 78. The gate lead of noninverting input transistor 74 is connected by lead 70 to lead 66 contained within one leg of source follower 14. The inverting input leg of the second differential amplifier stage 16 includes P channel MOSFET 88 and N channel MOSFET 76. The source lead of MOSFET 88 is connected to the $V_{DD}$ lead 22, the drain lead of MOSFET 88 is connected via lead 84 to output node 102, which in turn is connected to the source lead of MOSFET 76. The drain lead of MOSFET 76 is connected by lead 78 to the current source MOSFET 80. The gate lead of inverting input transistor 76 is connected by lead 72 to lead 68 in the second leg of source follower 14. The gate leads of MOSFETs 86 and 88 are interconnected by lead 90, and in turn connected to node 94 within lead 82. P channel MOSFETs 86 and 88 thus serve as load devices between the $V_{DD}$ lead 22 and MOSFETs 74 and 76, respectively.

Level shift stage 18 includes N channel MOSFET 96 and N channel MOSFET 98. N channel MOSFET 96 has its source lead connected to $V_{DD}$ lead 22, its drain lead connected by lead 106 to node 108 and the source lead of MOSFET 98, and its gate lead connected by lead 100 to node 102 within lead 84 of the inverting input leg of differential amplifier stage 16. MOSFET 98 has its drain terminal connected to the negative supply voltage $V_{SS}$ on lead 24, and its gate lead connected to the bias voltage $V_{BB}$ on lead 104, thereby causing MOSFET 98 to function as a constant current source.

The cascode output stage 20 includes P channel MOSFET 112, P channel MOSFET 114, and N channel MOSFET 110. The source lead of P channel MOSFET 112 is connected to the positive supply voltage $V_{DD}$ on lead 22. The drain lead of MOSFET 112 is connected to the source lead of MOSFET 114, and the drain lead of MOSFET 114 is connected to output node 118 and to the source lead of MOSFET 110. The drain lead of MOSFET 110 is connected to the negative supply voltage $V_{SS}$ on lead 24. The gate lead of P channel MOSFET 112 is connected to output node 102 of the second differential amplifier stage 16. The gate lead of MOSFET 114 is connected to ground, and the gate lead of MOSFET 110 is connected to node 108 in the level shift stage 18.

The operation of the circuit shown in the FIGURE is as follows. A first input signal is applied to the gate lead of MOSFET 34 and a second input signal (ground in the FIGURE) is applied to the gate of MOSFET 32. This causes a difference of the input signals to be amplified by the first differential amplifier 12 and output signals corresponding to the difference of the input signals are made available on nodes 62 and 64. Diodes 50 and 52 clamp the voltage on node 64 within one forward biased diode voltage drop of the voltage on node 62. This clamping limits the voltage excursion on node 64, thereby maintaining the first differential amplifier stage 12 in the saturation region of operation over a wider range of input signals, as comapred with an unclamped differential amplifier stage. Thus, the first differential amplifier stage 12 can return to the saturation region of operation (where differential amplifier state 12 operates with a very high gain) more rapidly than an unclamped differential amplifier circuit, for example, when a large differential input signal (e.g. 700 mv) was present on the input leads followed by the application of a small differential input signal (e.g. 0.1 mv) of the opposite polarity.

In one embodiment of this invention, each clamping means 50 and 52 comprises an NPN transistor having its emitter serving as the clamping means cathode, its base serving as the clamping means anode, and its collector connected to the positive voltage source $V_{DD}$, thus providing clamping means having current gain, thereby increasing the speed of the clamping action.

The output signals available on nodes 62 and 64 of the first differential amplifier stage 12 drive the source follower stage 14. The source follower stage 14 buffers the high output impedance of the first differential amplifier stage 12 from the high input capacitance of the second differential amplifier 16. The input capacitance of the second differential amplifier stage 16 is large due to Miller multiplication of the capacitances of the MOSFETs used in the second differential amplifier stage. Thus, the source follower stage 14 serves to broadband the first differential amplifier stage 12, thereby providing increased circuit speed over a circuit in which the first differential amplifier stage is connected directly to the second differential amplifier stage. Without the use of source follower stage 14 to buffer the high output impedance of the first differential amplifier stage and the high input capacitance of the second differential amplifier stage, the time constant, which is equal to the output impedance of the first differential amplifier stage 12 multiplied by input capacitance of the second differential amplifier stage 16, will be large, thus resulting in a rather slow circuit. Stage 14 reduces this time constant, thus making the circuit faster than it otherwise would be.

The output signals from the source follower stage 14 directly drive the input MOSFETs 74 and 76 of the second differential amplifier stage 16. The second differential amplifier stage serves to provide additional gain, and does not require diode clamping because it is not required to respond to small input signals as is first differential amplifier Stage 12. Differential amplifier Stage 16 receives from differential amplifier Stage 12 large (e.g. several hundred millivolts) input voltage swings.

The output signal on node 102 of the second differential amplifier stage 16 drives the final gain stage 20. The final gain stage 20 is a cascode stage. Cascode stages have low input capacitance, thereby providing a small time constant when driven by the second differential amplifier stage 16, thus providing a high speed circuit. Cascode stage 20 includes P channel MOSFETs 112 and 114 and N channel MOSFET 110. MOSFET 114 serves as a load and limits the output signal swing on output node 118, thereby limiting the gain on the node between MOSFETs 112 and 114, thus reducing the Miller multiplied input capacitance of the cascode stage 20 on node 102, thereby reducing the time constant between the second differential amplifier 16 and output stage 20, thus increasing circuit speed.

The level shift stage 18 includes N channel MOSFETs 96 and 98. Level shift stage 18 provides an output voltage on node 108 which drives N channel MOSFET 110 of the cascode stage 20. The voltage on node 108 is related to the output voltage on node 102 of the second differential amplifier stage 16, which serves as the input voltage to the gate of MOSFET 96 of level shift stage 18. P channel MOSFET 112 of cascode output stage 20 is driven directly by the output voltage on node 102 of the second differential amplifier stage 16. By driving the P channel MOSFET 112 directly by the output voltage on node 102 of the second differential amplifier stage 16, and driving N channel MOSFET 110 by a voltage on node 108 which is related to, but shifted in magnitude from, the output voltage on node 102, cascode stage 20 is operated in a class A-B mode, thereby conserving power as compared with the class A output stages typically utilized in voltage comparator circuits. The reason for this reduced power dissipation when the cascode stage 20 is driven in class A-B mode is that the average impedance presented by output stage 20 between the positive voltage supply $V_{DD}$ on lead 22 and the negative voltage supply $V_{SS}$ on lead 24 is greater than it would be if the gate of MOSFET 110 were connected to the bias voltage $V_{BB}$, and thus always turned on, as is typically the case in prior art circuits. In the comparator circuit 10 of this invention, the N channel output transistor 110 tends to turn off when the P channel output transistor 112 turns on, and vice versa, thereby increasing the average impedance presented by output stage 20 between leads 22 and 24, and thus decreasing power dissipation of the circuit.

In summary, it is seen that the comparator circuit 10 operates to receive and compare relatively small signals which are amplified by stages which also allow relatively large input signal swings. Thus, the circuit has a wide range of performance that can be applied to a variety of uses; and it also comprises relatively few components that can be compactly arranged in an integrated circuit semiconductor device.

In one embodiment of the comparator according to this invention an overall gain of 125 dB was achieved with 25 MHz unit gain bandwidth. Compared with prior art comparator circuits, this is a relatively high gain for a large bandwidth. This embodiment of the invention is capable of providing an accurate output signal, within 2 microseconds, in response to a difference in input signals of less than 300 microvolts. Compared with prior art comparator circuits, this is a relatively high speed resolution of a low input signal differential.

To those skilled in the art to which this invention relates, many changes in construction and widely differing embodiments and applications of the invention will suggest themselves without departing from the spirit and scope of the invention. The disclosures and the description herein are purely illustrative and are not intended to be in any sense limiting.

I claim:

1. An electronic comparator circuit comprising:
a first differential amplifier stage having a relatively high output impedance including:
a first current source;
an inverting input leg containing a load device, an inverting input transistor having an inverting input lead, and a first output node; and
a noninverting input leg containing a load device, a noninverting input transistor having a noninverting input lead, and a second output node;
a second differential amplifier stage having a relatively high input capacitance including:
a second current source, an inverting leg containing a load device and an inverting transistor having an inverting input lead; and
a noninverting leg containing a load device, a noninverting transistor having a noninverting input lead, and a third output node;
an impedance converting stage for reducing the relatively high output impedance of said first differential amplifier stage to drive the high input capacitance of said second differential amplifier stage, said impedance converting stage containing a first and a second leg, said first leg of said impedance converting stage containing a fourth output node, a third current source and a transistor having its control electrode connected to said first output node of said inverting input leg of said first differential amplifier stage, said fourth output node of said first leg of said impedance converting stage being connected to said noninverting input lead of said second differential amplifier stage, said second leg of said impedance converting stage containing a fifth output node, a fourth current source, and a transistor having its control electrode connected to said second output node of said noninverting input leg of said first differential amplifier stage, said fifth output node of said second leg of said impedance converting stage being connected to said inverting input lead of said second differential amplifier stage;

a level shift stage having an input lead connected to said third output node of said second differential amplifier stage, and having a sixth output node; and an output stage including a first output transistor having its control electrode connected to said third output node of said second differential amplifier stage, a second output transistor having its control electrode connected to said sixth output node of said level shift stage, a third output transistor having its control electrode connected to a voltage source, and a seventh output node.

2. Structure as in claim 1 wherein said level shift stage includes a fifth current source and a transistor having its control electrode connected to said input lead of said level shift stage.

3. Structure as in claim 1 including clamping means in said first differential amplifier stage for limiting the voltage on said first and second output nodes, thereby maintaining said first differential amplifier stage in saturation, thus increasing the speed of said first differential amplifier stage in response to large variations in input signals.

4. Structure as in claim 3 wherein said clamping means are diodes.

5. Structure as in claims 1, 2 or 3 wherein all of said transistors are MOSFET devices.

6. Structure as in claim 1 wherein one of said transistors of said output stage is an N channel MOSFET and the other said transistor of said output stage is a P channel MOSFET.

* * * * *

UNITED STATES PATENT AND TRADEMARK OFFICE
CERTIFICATE OF CORRECTION

PATENT NO. : 4,443,717
DATED : April 17, 1984
INVENTOR(S) : YUSUF A. HAQUE

It is certified that error appears in the above—identified patent and that said Letters Patent is hereby corrected as shown below:

Correct the inventor's name by deleting "Hague" and inserting
-- Haque--.

Column 1, line 25, delete "or" and insert --of--.

Signed and Sealed this

Twenty-eighth Day of August 1984

[SEAL]

Attest:

GERALD J. MOSSINGHOFF

Attesting Officer     Commissioner of Patents and Trademarks